(12) United States Patent
Jahagirdar et al.

(10) Patent No.: US 9,223,389 B2
(45) Date of Patent: *Dec. 29, 2015

(54) METHOD AND APPARATUS FOR A ZERO VOLTAGE PROCESSOR

(71) Applicant: Intel Corporation, Santa Clara, CA (US)

(72) Inventors: Sanjeev Jahagirdar, Folsom, CA (US); Varghese George, Folsom, CA (US); John B. Conrad, Folsom, CA (US); Robert Milstrey, Citrus Heights, CA (US); Stephen A. Fischer, Gold River, CA (US); Alon Naveh, Ramat Hasharon (IL); Shai Rotem, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/496,233

(22) Filed: Sep. 25, 2014

(65) Prior Publication Data

US 2015/0052377 A1    Feb. 19, 2015

Related U.S. Application Data

(63) Continuation of application No. 14/254,413, filed on Apr. 16, 2014, which is a continuation of application No. 12/706,631, filed on Feb. 16, 2010, now Pat. No. 8,707,062, which is a continuation of application No. 11/323,254, filed on Dec. 30, 2005, now Pat. No. 7,664,970.

(51) Int. Cl.
*G06F 1/32* (2006.01)
*G06F 12/08* (2006.01)
(Continued)

(52) U.S. Cl.
CPC ............ *G06F 1/3287* (2013.01); *G06F 1/3203* (2013.01); *G06F 1/3243* (2013.01);
(Continued)

(58) Field of Classification Search
CPC ... G06F 1/3287; G06F 1/3296; G06F 12/084; G06F 12/0875
See application file for complete search history.

(56) References Cited

U.S. PATENT DOCUMENTS 4,819,154 A    4/1989 Stiffler et al.
5,307,003 A    4/1994 Fairbanks et al.
(Continued)

FOREIGN PATENT DOCUMENTS

CN    1595332 A    3/2005
CN    1229710 C    11/2005
(Continued)

OTHER PUBLICATIONS

Chinese Patent Office, Notice of Reexamination mailed Sep. 4, 2014, In Chinese Application No. 200680050111.7.
(Continued)

*Primary Examiner* — Stefan Stoynov
(74) *Attorney, Agent, or Firm* — Trop, Pruner & Hu, P.C.

(57) ABSTRACT

Embodiments of the invention relate to a method and apparatus for a zero voltage processor sleep state. A processor may include a dedicated cache memory. A voltage regulator may be coupled to the processor to provide an operating voltage to the processor. During a transition to a zero voltage power management state for the processor, the operational voltage applied to the processor by the voltage regulator may be reduced to approximately zero and the state variables associated with the processor may be saved to the dedicated cache memory.

19 Claims, 6 Drawing Sheets

(51) Int. Cl.
*G06F 11/14* (2006.01)
*G11C 7/10* (2006.01)

(52) U.S. Cl.
CPC ............ *G06F1/3246* (2013.01); *G06F 1/3275* (2013.01); *G06F 1/3296* (2013.01); *G06F 11/1441* (2013.01); *G06F 12/084* (2013.01); *G06F 12/0875* (2013.01); *G11C 7/1072* (2013.01); *G06F 2212/281* (2013.01); *G06F 2212/305* (2013.01); *Y02B 60/1239* (2013.01); *Y02B 60/1285* (2013.01); *Y02B 60/32* (2013.01); *Y10T 307/305* (2015.04); *Y10T 307/406* (2015.04); *Y10T 307/582* (2015.04); *Y10T 307/826* (2015.04)

(56) References Cited

U.S. PATENT DOCUMENTS

| | | |
|---|---|---|
| 5,386,552 A | 1/1995 | Garney |
| 5,502,838 A | 3/1996 | Kikinis |
| 5,515,325 A | 5/1996 | Wada |
| 5,526,487 A | 6/1996 | Schiffleger |
| 5,530,879 A | 6/1996 | Crump et al. |
| 5,560,022 A | 9/1996 | Dunstan et al. |
| 5,592,671 A | 1/1997 | Hirayama |
| 5,623,677 A | 4/1997 | Townsley et al. |
| 5,627,412 A | 5/1997 | Beard |
| 5,632,038 A | 5/1997 | Fuller |
| 5,745,375 A | 4/1998 | Reinhardt et al. |
| 5,765,001 A | 6/1998 | Clark et al. |
| 5,784,628 A | 7/1998 | Reneris |
| 5,787,294 A | 7/1998 | Evoy |
| 5,812,860 A | 9/1998 | Horden et al. |
| 5,845,134 A | 12/1998 | Arai |
| 5,862,368 A | 1/1999 | Miller et al. |
| 5,870,616 A | 2/1999 | Loper et al. |
| 5,918,061 A | 6/1999 | Nikjou |
| 5,953,685 A | 9/1999 | Bogin et al. |
| 5,990,516 A | 11/1999 | Momose et al. |
| 6,021,500 A | 2/2000 | Wang et al. |
| 6,047,248 A | 4/2000 | Georgiou et al. |
| 6,061,711 A | 5/2000 | Song et al. |
| 6,115,763 A | 9/2000 | Douskey et al. |
| 6,118,306 A | 9/2000 | Orton et al. |
| 6,141,762 A | 10/2000 | Nicol et al. |
| 6,154,846 A | 11/2000 | Arai |
| 6,167,488 A | 12/2000 | Koppala |
| 6,205,521 B1 | 3/2001 | Schumann |
| 6,223,208 B1 | 4/2001 | Kiefer et al. |
| 6,223,293 B1 | 4/2001 | Foster et al. |
| 6,230,274 B1 | 5/2001 | Stevens et al. |
| 6,272,642 B2 | 8/2001 | Pole, II et al. |
| 6,363,490 B1 | 3/2002 | Senyk |
| 6,389,556 B1 | 5/2002 | Qureshi |
| 6,408,325 B1 | 6/2002 | Shaylor |
| 6,411,157 B1 | 6/2002 | Hsu et al. |
| 6,415,388 B1 | 7/2002 | Browning et al. |
| 6,438,658 B1 | 8/2002 | Baliga et al. |
| 6,499,102 B1 | 12/2002 | Ewertz |
| 6,502,196 B1 | 12/2002 | Chang et al. |
| 6,505,216 B1 | 1/2003 | Schutzman et al. |
| 6,523,128 B1 | 2/2003 | Stapleton et al. |
| 6,535,798 B1 | 3/2003 | Bhatia et al. |
| 6,542,996 B1 | 4/2003 | Chang et al. |
| 6,550,020 B1 | 4/2003 | Floyd et al. |
| 6,571,341 B1 | 5/2003 | Forbes |
| 6,584,573 B1 | 6/2003 | Wunderlich et al. |
| 6,633,987 B2 | 10/2003 | Jain et al. |
| 6,691,216 B2 | 2/2004 | Kelly et al. |
| 6,691,234 B1 | 2/2004 | Huff |
| 6,691,238 B1 | 2/2004 | Forbes et al. |
| 6,711,447 B1 | 3/2004 | Saeed |
| 6,711,691 B1 | 3/2004 | Howard et al. |
| 6,714,891 B2 | 3/2004 | Dendinger |
| 6,729,551 B2 | 5/2004 | Lyons et al. |
| 6,738,675 B2 | 5/2004 | Dai |
| 6,748,545 B1 | 6/2004 | Helms |
| 6,792,551 B2 | 9/2004 | Dai |
| 6,804,790 B2 | 10/2004 | Rhee et al. |
| 6,823,240 B2 | 11/2004 | Cooper |
| 6,885,233 B2 | 4/2005 | Huard et al. |
| 6,901,298 B1 | 5/2005 | Govindaraj et al. |
| 6,920,574 B2 | 7/2005 | Youngs |
| 6,954,864 B2 | 10/2005 | Schelling |
| 6,968,469 B1 | 11/2005 | Fleischmann et al. |
| 6,983,386 B2 | 1/2006 | Barr et al. |
| 6,988,214 B1 | 1/2006 | Verdun |
| 7,010,438 B2 | 3/2006 | Hancock et al. |
| 7,043,405 B2 | 5/2006 | Orenstien et al. |
| 7,043,649 B2 | 5/2006 | Terrell, II |
| 7,076,672 B2 | 7/2006 | Naveh et al. |
| 7,080,269 B2 | 7/2006 | Baumgartner et al. |
| 7,093,147 B2 | 8/2006 | Farkas et al. |
| 7,103,786 B2 | 9/2006 | Chen et al. |
| 7,127,560 B2 | 10/2006 | Cohen et al. |
| 7,134,031 B2 | 11/2006 | Flautner |
| 7,136,984 B2 | 11/2006 | Maiyuran et al. |
| 7,174,469 B2 | 2/2007 | Luick |
| 7,219,248 B2 | 5/2007 | Shikata |
| 7,356,647 B1 | 4/2008 | Andrighetti et al. |
| 7,363,523 B2 | 4/2008 | Kurts et al. |
| 7,380,149 B2 | 5/2008 | Ozawa et al. |
| 7,389,403 B1 | 6/2008 | Alpert et al. |
| 7,401,240 B2 | 7/2008 | Heller, Jr. et al. |
| 7,412,565 B2 | 8/2008 | Wirasinghe et al. |
| 7,437,513 B2 | 10/2008 | Saida et al. |
| 7,451,333 B2 | 11/2008 | Naveh et al. |
| 7,480,813 B2 * | 1/2009 | Asoh et al. .................. 713/324 |
| 7,502,887 B2 | 3/2009 | Tanaka et al. |
| 7,546,418 B2 | 6/2009 | Verdun |
| 7,590,869 B2 | 9/2009 | Hashimoto |
| 7,664,970 B2 | 2/2010 | Jahagirdar et al. |
| 7,848,718 B2 | 12/2010 | Koch et al. |
| 7,953,993 B2 | 5/2011 | Allarey et al. |
| 7,966,511 B2 | 6/2011 | Naveh et al. |
| 2002/0007463 A1 | 1/2002 | Fung |
| 2002/0026597 A1 | 2/2002 | Dai et al. |
| 2002/0042870 A1 | 4/2002 | Rocray et al. |
| 2002/0083356 A1 | 6/2002 | Dai |
| 2002/0087219 A1 | 7/2002 | Dai |
| 2002/0095610 A1 | 7/2002 | Nunomura |
| 2003/0009702 A1 | 1/2003 | Park |
| 2003/0056127 A1 | 3/2003 | Vaglica |
| 2003/0101362 A1 | 5/2003 | Dia |
| 2003/0204760 A1 | 10/2003 | Youngs |
| 2003/0217299 A1 | 11/2003 | Neuman et al. |
| 2003/0233591 A1 | 12/2003 | Chiteboun et al. |
| 2004/0019815 A1 | 1/2004 | Vyssotski et al. |
| 2004/0044917 A1 | 3/2004 | Lee et al. |
| 2004/0098631 A1 | 5/2004 | Terrell, II |
| 2004/0098635 A1 | 5/2004 | Cho et al. |
| 2004/0117678 A1 | 6/2004 | Soltis, Jr. et al. |
| 2004/0153694 A1 | 8/2004 | Nicholson et al. |
| 2005/0005073 A1 | 1/2005 | Pruvost et al. |
| 2005/0009509 A1 | 1/2005 | Miscopein et al. |
| 2005/0044429 A1 | 2/2005 | Gaskins et al. |
| 2005/0044448 A1 | 2/2005 | Verdun |
| 2005/0055591 A1 | 3/2005 | Cho |
| 2005/0080994 A1 | 4/2005 | Cohen et al. |
| 2005/0086551 A1 | 4/2005 | Wirasinghe et al. |
| 2005/0097277 A1 | 5/2005 | Maiyuran et al. |
| 2005/0108589 A1 | 5/2005 | Kadatch et al. |
| 2005/0246499 A1 | 11/2005 | Saida et al. |
| 2005/0283628 A1 | 12/2005 | Youngs |
| 2005/0283679 A1 | 12/2005 | Heller, Jr. et al. |
| 2006/0026447 A1 | 2/2006 | Naveh et al. |
| 2006/0047986 A1 | 3/2006 | Kurts et al. |
| 2006/0053325 A1 | 3/2006 | Chary et al. |
| 2006/0053326 A1 | 3/2006 | Naveh et al. |
| 2006/0059486 A1 | 3/2006 | Loh et al. |
| 2006/0071945 A1 | 4/2006 | Anabuki |
| 2006/0143485 A1 | 6/2006 | Naveh et al. |
| 2007/0043965 A1 | 2/2007 | Mandelblat et al. |
| 2007/0136530 A1 | 6/2007 | Tanaka |

(56) References Cited

U.S. PATENT DOCUMENTS

| | | | |
|---|---|---|---|
| 2007/0137036 | A1 | 6/2007 | Jeon |
| 2007/0156992 | A1 | 7/2007 | Jahagirdar |
| 2007/0157036 | A1 | 7/2007 | Jahagirdar et al. |
| 2010/0146311 | A1 | 6/2010 | Jahagirdar et al. |
| 2011/0252267 | A1 | 10/2011 | Naveh et al. |
| 2012/0072750 | A1 | 3/2012 | Jahagirdar et al. |
| 2012/0191995 | A1 | 7/2012 | Naveh et al. |
| 2013/0013945 | A1 | 1/2013 | Jahagirdar et al. |
| 2013/0097437 | A9 | 4/2013 | Naveh et al. |
| 2015/0058667 | A1 | 2/2015 | Jahagirdar et al. |

FOREIGN PATENT DOCUMENTS

| | | | |
|---|---|---|---|
| CN | 1993669 | A | 7/2007 |
| DE | 11 2005 001 779 | T5 | 5/2007 |
| EP | 0 978 781 | A2 | 2/2000 |
| EP | 1 286 248 | A2 | 2/2003 |
| EP | 1 424 628 | A2 | 6/2004 |
| JP | 1-095355 | A | 4/1989 |
| JP | 7-182870 | A | 7/1995 |
| JP | 10-091603 | A | 4/1998 |
| JP | 2004-038642 | A | 2/2004 |
| JP | 2004-507809 | A | 3/2004 |
| JP | 2005-011166 | A | 1/2005 |
| JP | 2005-099984 | A | 4/2005 |
| JP | 2005-217436 | A | 8/2005 |
| TW | 200508975 | A | 3/2005 |
| WO | 98/44405 | A1 | 10/1998 |
| WO | 01/01228 | A1 | 1/2001 |
| WO | 01/35200 | A1 | 5/2001 |
| WO | 02/08874 | A2 | 1/2002 |
| WO | 02/17052 | A2 | 2/2002 |
| WO | 2005/048112 | A1 | 5/2005 |

OTHER PUBLICATIONS

State Intellectual Property Office, P.R. China, Office Action and Search Report for corresponding Patent Application No. 201110274214.4, issued Jul. 15, 2013, 7 pages.
English Translation of State Intellectual Property Office, P.R. China, Office Action and Search Report for corresponding Patent Application No. 201110274214.4, issued Jul. 15, 2013, 9 pages.
U.S. Patent and Trademark Office, Notice of Allowance for U.S. Appl. No. 12/706,631, Jul. 23, 2013 mail date, 9 pages.
U.S. Patent and Trademark Office, Notice of Allowance for U.S. Appl. No. 12/706,631, Nov. 4, 2013 mail date, 9 pages.
U.S. Patent and Trademark Office, Office Action for U.S. Appl. No. 10/931,565, mailed Nov. 16, 2006, 24 pages.
U.S. Patent and Trademark Office, Office Action for U.S. Appl. No. 10/931,565, May 24, 2007 mail date, 23 pages.
U.S. Patent and Trademark Office, Office Action for U.S. Appl. No. 10/931,565, mailed Nov. 30, 2007, 7 pages.
U.S. Patent and Trademark Office, Office Action for U.S. Appl. No. 10/899,674, Mar. 19, 2007 mail date, 18 pages.
U.S. Patent and Trademark Office, Office Action for U.S. Appl. No. 10/899,674, Oct. 4, 2007 mail date, 7 pages.
International Searching Authority, Invitation to Pay Additional Fees and Annex (Results of Partial International Search) for PCT/US2005/028699, mailed Mar. 2, 2006, 10 pages.
U.S. Patent and Trademark Office, Office Action for U.S. Appl. No. 10/934,034, Dec. 28, 2006 mail date, 17 pages.
U.S. Patent and Trademark Office, Office Action for U.S. Appl. No. 10/934,034, Jul. 13, 2007 mail date, 12 pages.
U.S. Patent and Trademark Office, Office Action for U.S. Appl. No. 10/934,034, mailed Jul. 1, 2008, 5 pages.
U.S. Patent and Trademark Office, Office Action for U.S. Appl. No. 11/024,538, Apr. 5, 2007 mail date, 8 pages.
U.S. Patent and Trademark Office, Office Action for U.S. Appl. No. 11/024,538, Oct. 9, 2007 mail date, 8 pages.
U.S. Patent and Trademark Office, Office Action for U.S. Appl. No. 11/024,538, Apr. 17, 2008 mail date, 7 pages.
U.S. Patent and Trademark Office, Office Action for U.S. Appl. No. 11/024,538, Dec. 16, 2008 mail date, 7 pages.
U.S. Patent and Trademark Office, Office Action for U.S. Appl. No. 11/323,259, Mar. 11, 2009 mail date, 23 pages.
U.S. Patent and Trademark Office, Office Action for U.S. Appl. No. 11/323,259, Oct. 13, 2009 mail date, 17 pages.
U.S. Patent and Trademark Office, Office Action for U.S. Appl. No. 11/323,259, Feb. 16, 2012 notification date, 19 pages.
International Searching Authority, International Search Report and Written Opinion for corresponding International Application No. PCT/US2006/048296, mailed Jun. 6, 2007, 14 pages.
International Bureau of WIPO, International Preliminary Report on Patentability for corresponding International Application No. PCT/US2006/048296, issued Jul. 1, 2008, 7 pages.
U.S. Patent and Trademark Office, Office Action for corresponding U.S. Appl. No. 11/323,254, Aug. 29, 2008 mail date, 23 pages.
U.S. Patent and Trademark Office, Office Action for corresponding U.S. Appl. No. 11/323,254, Feb. 3, 2009 mail date, 15 pages.
U.S. Patent and Trademark Office, Office Action for corresponding U.S. Appl. No. 11/323,254, May 15, 2009 mail date, 3 pages.
U.S. Patent and Trademark Office, Office Action for corresponding U.S. Appl. No. 11/323,254, mailed Sep. 30, 2009, 16 pages.
U.S. Patent and Trademark Office, Office Action for corresponding U.S. Appl. No. 12/706,631, Jun. 19, 2012 notification date, 21 pages.
U.S. Patent and Trademark Office, Office Action for corresponding U.S. Appl. No. 12/706,631, mailed Jan. 8, 2013, 5 pages.
U.S, Patent and Trademark Office, Office Action for corresponding U.S. Appl. No. 12/706,631, mailed Apr. 18, 2013, 12 pages.
U.S. Patent and Trademark Office, Office Action for corresponding U.S. Appl. No. 13/220,413, Apr. 16, 2013 mail date, 12 pages.
U.S. Patent and Trademark Office, Office Action for corresponding U.S. Appl. No. 13/619,998, Dec. 13, 2012 mail date, 9 pages.
U.S.Patent and Trademark Office, Office Action for corresponding U.S. Appl. No. 11/937,139, Aug. 11, 2010 mail date, 20 pages.
U.S. Patent and Trademark Office, Office Action for corresponding U.S. Appl. No. 11/937,139, mailed Dec. 17, 2010, 10 pages.
U.S. Patent and Trademark Office, Office Action for corresponding U.S. Appl. No. 11/937,139, mailed Jan. 11, 2011, 8 pages.
State Intellectual Property Office, P.R. China, Office Action for corresponding Patent Application No. 200680050111.7, issued Sep. 18, 2009, 7 pages.
English Translation of State Intellectual Property Office, P.R. China, Office Action for corresponding Patent Application No. 200680050111.7, issued Sep. 18, 2009, 10 pages.
State Intellectual Property Office, P.R. China, Office Action for corresponding Patent Application No. 200680050111.7, issued May 5, 2011, 6 pages.
English Translation of State Intellectual Property Office, P.R. China, Office Action for corresponding Patent Application No. 200680050111.7, issued May 5, 2011, 8 pages.
State Intellectual Property Office, P.R. China, Office Action for corresponding Patent Application No. 200680050111.7, issued Apr. 23, 2012, 5 pages.
English Translation of State Intellectual Property Office, P.R. China, Office Action for corresponding Patent Application No. 200680050111.7, issued Apr. 23, 2012, 8 pages.
State Intellectual Propert Office, P.R. China, Decision on Rejection for corresponding Patent Application No. 200680050111.7, issued Feb. 5, 2013, 5 pages.
English Translation of State Intellectual Property Office, P.R. China, Decision on Rejection for corresponding Patent Application No. 200680050111.7, issued Feb. 5, 2013, 8 pages.
German Patent and Trade Mark Office Decision for corresponding Patent Application No. 11 2006 003 575.4, mailed Dec. 9, 2011, 4 pages.
English Translation of German Patent and Trade Mark Office Decision for corresponding Patent Application No. 11 2006 003 575.4, mailed Dec. 9, 2011, 2 pages.
Japan Patent Office, Notice of Reasons for Rejection for corresponding Patent Application No. 2008-541442, delivered Aug. 24, 2010, 2 pages.

(56) References Cited

OTHER PUBLICATIONS

English Translation of Japan Patent Office, Notice of Reasons for Rejection for corresponding Patent Application No. 2008-541442, delivered Aug. 24, 2010, 2 pages.
Japan Patent Office, Decision of Rejection for corresponding Patent Application No. 2008-541442, delivered May 17, 2011, 1 page.
English Translation of Japan Patent Office, Decision of Rejection for corresponding Patent Application No. 2008-541442, delivered May 17, 2011, 1 page.
Korean Intellectual Property Office, Notice of Preliminary Rejection for corresponding Patent Application No. 10-2008-7015968, mailed Jan. 28, 2010, 4 pages.
English Translation of Korean Intellectual Property Office, Notice of Preliminary Rejection for corresponding Patent Application No. 10-2008-7015968, mailed Jan. 28, 2010, 4 pages.
Korean Intellectual Property Office, Notice of Final Rejection for corresponding Patent Application No. 10-2008-7015968, mailed Sep. 6, 2010, 2 pages.
English Translation of Korean Intellectual Property Office, Notice of Final Rejection for corresponding Patent Application No. 10-2008-7015968, mailed Sep. 6, 2010, 2 pages.
Taiwan Intellectual Property Office, Office Action and Search Report for corresponding Patent Application No. 95147692, 9 pages.
English Translation of Taiwan Intellectual Property Office, Office Action and Search Report or corresponding Patent Application No. 95147692, 10 pages.
Patent Abstracts of Japan, Publication No. JP 01-095355 which was published Apr. 13, 1989, 1 page.
Patent Abstracts of Japan, Publication No. JP 08-221060 which was published Aug. 30, 1996, 1 page.
Patent Abstracts of Japan, Publication No. JP 2004-038642 which was published Feb. 5, 2004, 1 page.
Computer Translation of Publication No. JP 2004-038642 A which was published Feb. 5, 2004, 18 pages.
Patent Abstracts of Japan, Publication No. JP 2005-011166 which as published Jan. 13, 2005, 1 page.
Computer Translation of Publication No. JP 2005-011166 A which was published Jan. 13, 2005, 14 pages.
Albonesi, David H., "Selective Cache Ways: On-Demand Cache Resource Allocation", Proceedings of the 32nd Annual ACM/IEEE International Symposium on Microarchitecture, pp. 248-259 (1999).
Compaq Computer Corp., Intel Corp., Microsoft Corp., Phoenix Technologies Ltd., Toshiba Corp. "Advanced Configuration and Power Interface Specification," Revision 2.0b, pp. i-xviii and 219-232, Oct. 11, 2002.
U.S. Appl. No. 14/254,422, filed Apr. 16, 2014, entitled "Method and Apparatus for a Zero Voltage Processor Sleep State," by Jose Allerey, et al.
U.S. Appl. No. 14/630,909, filed Feb. 25, 2015, entitled "Method and Apparatus for a Zero Voltage Processor Sleep State," by Sanjeev Jahagirdar, et al.
U.S. Patent and Trademark Office, Office Action mailed Nov. 20, 2014 with Reply filed Feb. 20, 2015, in U.S. Appl. No. 14/254,422.
Chinese Patent Office, Reexamination Decision mailed Feb. 3, 2015, in Chinese Patent Application No. 200680050111.7.
U.S. Patent and Trademark Office, Office Action mailed May 15, 2015, with Reply filed Aug. 12, 2015, in U.S. Appl. No. 14/254,413.
U.S. Patent and Trademark Office, Office Action mailed May 15, 2015, with Reply filed Aug. 12, 2015, in U.S. Appl. No. 14/496,345.
U.S. Patent and Trademark Office, Notice of Allowance mailed May 20, 2015, in U.S. Appl. No. 14/630,909.
Chinese Patent Office, Chinese Notice of Reexamination mailed on Aug. 26, 2015 in Chinese Patent Application No. 201110274214.4.

\* cited by examiner

METHOD AND APPARATUS FOR A ZERO VOLTAGE PROCESSOR

CLAIM TO PRIORITY

This application is continuation of U.S. patent application Ser. No. 14/254,413, filed Apr. 16, 2014, which is a continuation of U.S. patent application Ser. No. 12/706,631, filed on Feb. 16, 2010, now U.S. Pat. No. 8,707,062, issued Apr. 22, 2014, which is a continuation of U.S. patent application Ser. No. 11/323,254, filed on Dec. 30, 2005, now U.S. Pat. No. 7,664,970, issued on Feb. 16, 2010, all of which are hereby incorporated by reference in their entirety into this application.

CROSS REFERENCE TO RELATED APPLICATIONS

This application is related to U.S. application Ser. No. 10/931,565 filed Aug. 31, 2004 by inventors Kurts et al., assigned to Intel Corporation; U.S. application Ser. No. 10/934,034 filed Sep. 3, 2004 by inventors Naveh et al. assigned to Intel Corporation; U.S. application Ser. No. 11/024,538 filed Dec. 28, 2004 by inventors Naveh et al. assigned to Intel Corporation; U.S. application Ser. No. 10/899,674 filed Jul. 27, 2004 by inventors Naveh et al. assigned to Intel Corporation; and to concurrently filed patent application entitled "Method and System for Optimizing Latency of Dynamic Memory Sizing" by inventor Jahagirdar, assigned to Intel Corporation, Docket Number 042390.P22076.

BACKGROUND

1. Field

Embodiments of the invention relate to the field of electronic systems and power management. More particularly, embodiments of the invention relate to a method and apparatus for a zero voltage processor sleep state.

2. Description of Related Art

As the trend toward advanced microprocessors, e.g. central processing units (CPUs), with more transistors and higher frequencies continues to grow, computer designers and manufacturers are often faced with corresponding increases in power and energy consumption. Particularly in mobile devices, increased power consumption can lead to overheating, which may negatively affect performance, and can significantly reduce battery life. Because batteries typically have a limited capacity, running the processor of a mobile device more than necessary could drain the capacity more quickly than desired.

Thus, power consumption continues to be an important issue for mobile devices including laptop computers, wireless handsets, personal digital assistants, etc. In today's mobile devices, for example, to address power dissipation concerns, certain components may be placed into lower power sleep states based on reduced activity or demand.

For one approach, an operating system may support a built-in power management software interface such as Advanced Configuration and Power Interface (ACPI) (e.g. Advanced Configuration and Power Interface, Ver. x285, June 2004). ACPI describes a power management policy including various "C states" that may be supported by processors and/or chipsets. For this policy, C0 is defined as the Run Time state in which the processor operates at high voltage and high frequency. C1 is defined as the Auto HALT state in which the core clock is stopped internally. C2 is defined as the Stop Clock state in which the core clock is stopped externally. C3 is defined as a Deep Sleep state in which all processor clocks are shut down, and C4 is defined as a Deeper Sleep state in which all processor clocks are stopped and the processor voltage is reduced to a lower data retention point. Various additional deeper sleep power states C5 ... Cn have also been proposed. These additional power states are characterized by equivalent semantics of the C1 through C4 powers states, but with different entry/exit latencies and power savings.

In operation, to enter the deeper sleep states, ACPI may detect a time slot in which there are no new or pending interrupts to the mobile processor. The ACPI policy then uses an input/output (I/O) controller or other chipset features to place the mobile processor into the deeper sleep states.

Once the processor is placed into the deeper sleep state, a break event or interrupt from the operating system or another source may be sent to the chipset, and the chipset will then allow the processor to exit the deeper sleep state. The ability to transition between various power management states, including deeper sleep states, may enable power dissipation to be reduced and battery life to be increased.

Currently, entry into deeper sleep states is done by referencing an external voltage reference in a processor voltage regulator circuit and regulating to this reference voltage whenever a platform "Deeper Sleep" signal such as a DPRSLPVR signal or other similar signal is asserted by the I/O controller or other integrated circuit. The voltage regulator then transitions from a first voltage to a second lower voltage associated with the deeper sleep state. Upon exiting the deeper sleep state, a voltage transition in the other direction takes place with a similar specified time window.

As previously noted, obtaining low power sleep states is important to achieving better battery life in mobile devices. The mobile device market is a fiercely competitive product space and one of the key areas for advancement in this space is low-power solutions to preserve battery life.

Unfortunately, existing deeper sleep states for processors in mobile devices still burn a non-neglible amount of power because voltage is still required to be applied to the processor and cannot be completely powered off.

DESCRIPTION

In the following description, the various embodiments of the invention will be described in detail. However, such details are included to facilitate understanding of the invention and to describe exemplary embodiments for employing the invention. Such details should not be used to limit the invention to the particular embodiments described because other variations and embodiments are possible while staying within the scope of the invention. Furthermore, although numerous details are set forth in order to provide a thorough understanding of the embodiments of the invention, it will be apparent to one skilled in the art that these specific details are not required in order to practice the embodiments of the invention.

In the following description, particular components, circuits, state diagrams, software modules, systems, timings, etc. are described for purposes of illustration. It will be appreciated, however, that other embodiments are applicable to other types of components, circuits, state diagrams, software modules, systems, and/or timings, for example.

Figure 1:
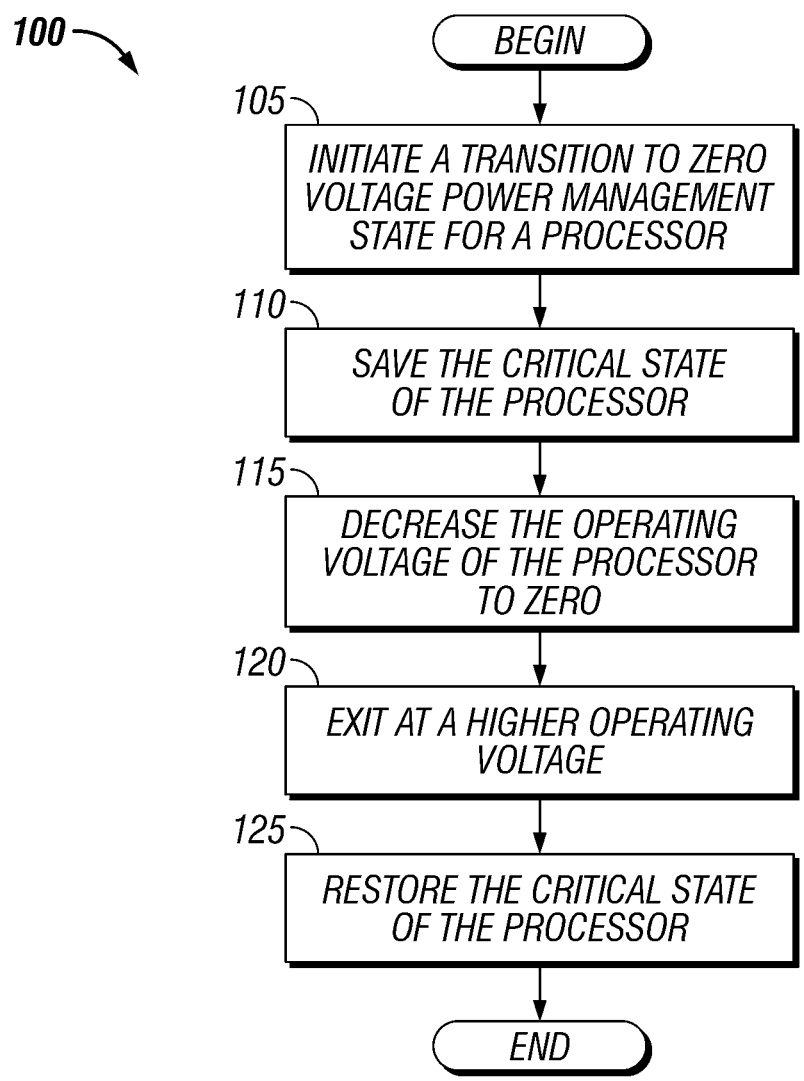
FIG. 1 is a flow diagram illustrating a process to transition into and transition out of a zero voltage power management state for a processor, according to one embodiment of the present invention.

With reference to FIG. 1, in one embodiment, an integrated circuit device such as a processor, for example, initiates a transition to a zero voltage power management state at block 105. The zero voltage power management state may be, for example, a Deeper Sleep state in accordance with the Advanced Configuration and Power Interface (ACPI) Specification, Revision 2.0a dated Mar. 31, 2002 (and published by Compaq Computer Corporation, Intel Corporation, Microsoft Corporation, Phoenix Technologies Ltd., and Toshiba Corporation). During this transition, the critical state of the processor is saved (block 110). The critical state of the processor includes state variables associated with the architectural, micro-architectural, debug state, and/or similar state variables associated with that processor. The operating voltage of the processor is subsequently reduced to approximately zero such that the processor is in a very deep sleep state that has very low power consumption characteristics (block 115). Hereinafter reference to the state or critical state of the processor or CPU will be meant to include state variables associated with the processor or CPU.

Subsequently, in response to receiving a request to exit the zero voltage power management state, the processor exits the zero voltage power management at a higher reference operating voltage at block 120. The critical state variables associated with the processor are also restored (block 125). It should be noted that for some embodiments, the reference operating voltage may be a minimum active state operating voltage, for example.

Further details of this and other embodiments are provided in the description that follows.

Embodiments of the invention may be implemented in one or a combination of hardware, firmware, and software. Embodiments of the invention may also be implemented in whole or in part as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

Figure 2A:
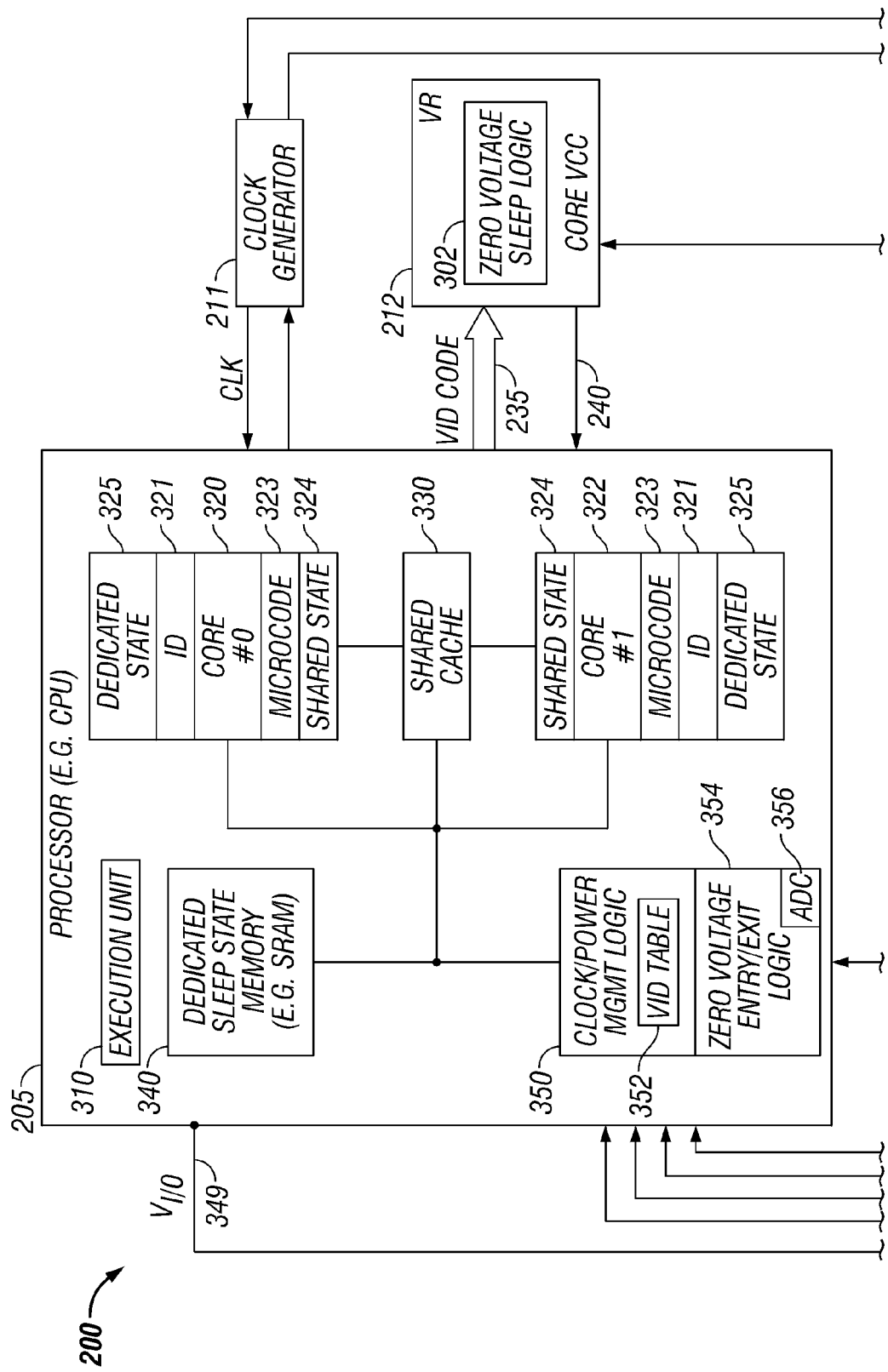
FIGS. 2A and 2B are block diagrams of an exemplary system that may be utilized to implement the zero voltage power management state approach, according to one embodiment of the present invention.
Figure 2B:
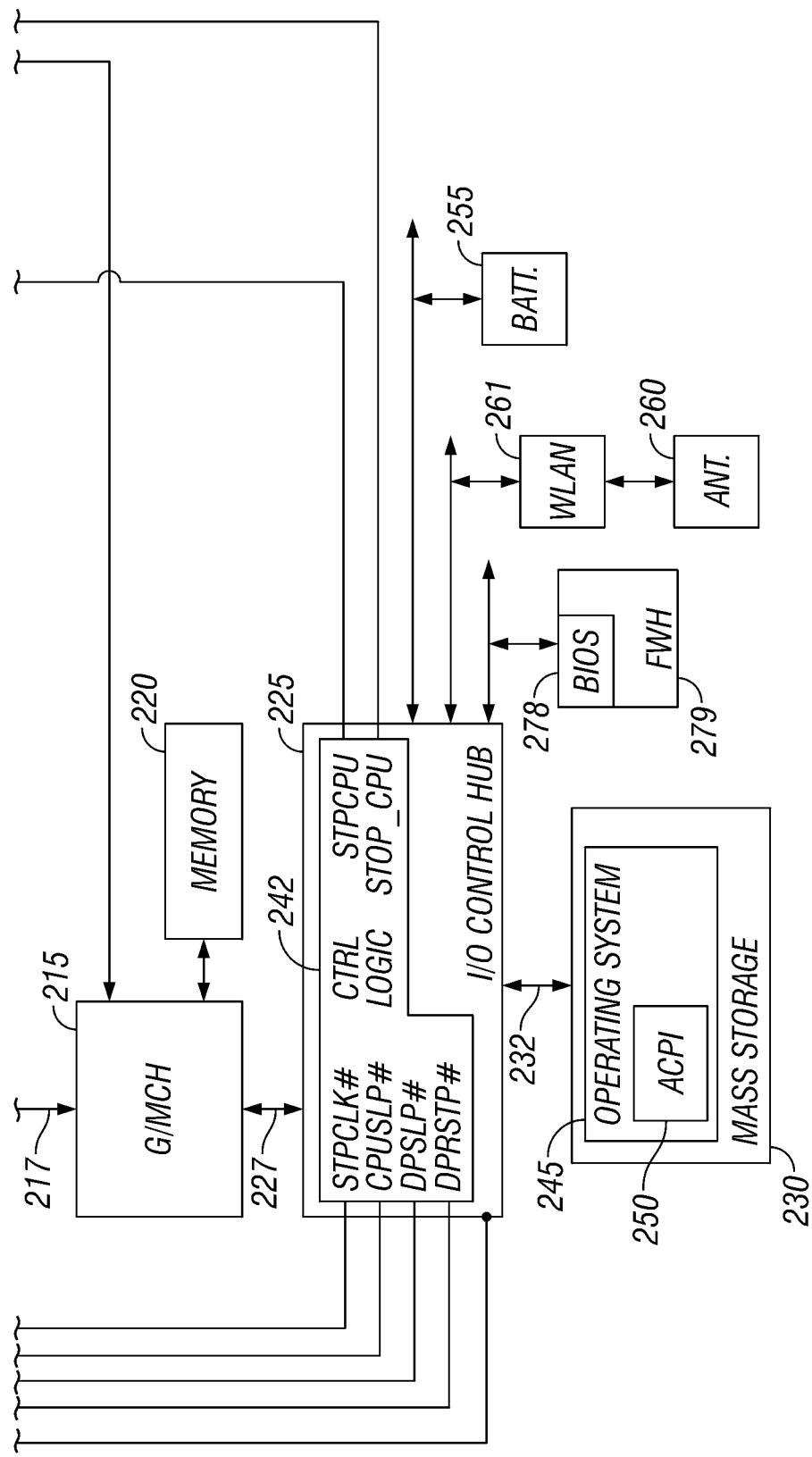

FIGS. 2A and 2B are block diagrams of an exemplary system 200 that may implement the zero voltage power management state transition approach of one or more embodiments. It should be noted that FIG. 2 is divided into 2A and 2B. The system 200 may be a notebook or laptop computer system, or may be any different type of mobile electronic system such as a mobile device, personal digital assistant, wireless telephone/handset or may even be a non-mobile system such as a desktop or enterprise computing system. Other types of electronic systems are also within the scope of various embodiments.

The system 200 includes a processor 205, a platform-level clock generator 211, a voltage regulator 212 coupled to the processor 205, a memory control hub 215 coupled to the processor 205 over a bus 217, a memory 220 which may comprise one or more of random access memory (RAM), flash memory and/or another type of memory, an input/output (I/O) control hub 225 coupled to the memory control hub 215 over a bus 227, and a mass storage device 230 coupled to the I/O control hub 225 over a bus 232. Although, system 200, in one embodiment, may be a mobile device with the subsystems described, it should be appreciated that system 200 may be a different type of mobile device or a non-mobile device, with more or less than the subsystems described.

In one embodiment, the processor 205 may be an Intel® architecture microprocessor such as, for example, a follow-on processor to the Intel Pentium® M processor including one or more processing cores (e.g. 320 and 322) and at least one execution unit 310 to process instructions. For such embodiments, the processor 205 may include Intel SpeedStep® technology or another power management-related technology that provides for two or more voltage/frequency operating points. An associated clock/power management unit 350 may be included in the processor 205 to control transitions between two or more of the voltage/frequency pairs.

In other embodiments, the processor 205 may be a different type of processor such as a digital signal processor, an embedded processor, or a microprocessor from a different source.

Further, processor 205 may include a dedicated cache memory 340 (e.g. synchronous random access memory (SRAM)) that may be used to store the processor's critical state variables when the processor enters the zero-voltage sleep state, as will be described. Cache memories may be built into the processor's chip or packaged within the same housing as the processor chip.

Where Intel SpeedStep® technology or another type of power management technology is included on the processor 205, the available voltage/frequency pairs associated with the technology include a minimum voltage/frequency pair corresponding to a minimum active mode operating voltage and a minimum operating frequency associated with the processor 205 for a fully functional operational mode. These may be referred to herein as the minimum operating voltage and minimum operating frequency or minimum active mode operating voltage and frequency, respectively. Similarly, a maximum operating voltage and frequency may be defined. Other available voltage frequency pairs may be referred to as operating voltage/frequency pairs or simply other voltage/frequency or frequency/voltage pairs.

Zero voltage entry/exit logic 354 may also be included in processor 205, either within or outside of the power management logic 350, to control entry into and exit from the zero voltage sleep state, also referred to herein as the C6 state. The low-power zero voltage processor sleep state will be described in more detail hereinafter.

A voltage identification (VID) memory 352 that is accessible by the zero voltage entry/exit logic 354 may be included to store a voltage identification code look-up table. The VID memory may be an on-chip or off-chip register or another type of memory, and the VID data may be loaded into the memory via software, basic input/output system (BIOS) code 278 (which may be stored on a firmware hub 279 or in another memory), an operating system, other firmware and/or may be hardcoded, for example. Alternatively, a software look-up table including VID and related data may be otherwise accessible by the logic 350. The VID information may also be stored on the CPU as fuses (e.g., programmable ROMs (PROMs)).

An analog-to-digital converter (ADC) 356 may also be provided as part of the zero voltage entry/exit logic 350 to monitor a voltage supply level and provide an associated digital output as described in more detail below.

Voltage regulator 212 provides a supply operating voltage to the processor 205 and may be in accordance with a version of the Intel Mobile Voltage Positioning (IMVP) specification such as the IMVP-6 specification, for example. For such embodiments, the voltage regulator 212 is coupled to receive VID signals from the processor 205 over a bus 235 and, responsive to the VID signals, provides an associated operating voltage to the processor 205 over a signal line 240. The voltage regulator 212 may include zero voltage sleep logic 302 that is responsive to one or more signals to reduce voltage 240 to the processor 205 to a zero state and then ramp the voltage to the processor back up again after exiting the zero voltage sleep state. For other embodiments, a different type of voltage regulator may be used, including a voltage regulator in accordance with a different specification. Further, for some embodiments, the voltage regulator may be integrated with another component of the system 200 including the processor 205. It should be appreciated that the voltage regulator may or may not be integrated with the CPU dependent upon design considerations.

The memory control hub 215 may include both graphics and memory control capabilities and may alternatively be referred to herein as a graphics and memory control hub (G/MCH) or a North bridge. The graphics and memory control hub 215 and the I/O control hub 225 (which also may be referred to as a South bridge) may be collectively referred to as the chipset. For other embodiments, chipset features may be partitioned in a different manner and/or may be implemented using a different number of integrated circuit chips. For example, for some embodiments, graphics and memory control capabilities may be provided using separate integrated circuit devices.

The I/O control hub 225 of one embodiment includes power management state control logic 242, alternatively referred to herein as C-state control logic. The power management state control logic 242 may control aspects of the transitions between some power management and/or normal operational states associated with the processor 205, either autonomously or in response to operating system or other software or hardware events. For example, for Intel® architecture processors for which at least active mode and power management states referred to as C0, C1, C2 and C4 are supported, the power management state control logic 242 may at least partially control transitions between at least a subset of these states using one or more of a stop clock (STPCLK#), processor sleep (SLP#), deep sleep (DPSLP#), deeper stop (DPRSTP#), and/or stop processor (STPCPU#) signals as described in more detail below.

Also, in one embodiment, voltage from the I/O control hub 225 (V.sub.I/O 349) may be provided to the processor 205 in order to provide sufficient power to the dedicated cache memory 340 such that it can store the critical state variables associated with the processor 205 while the rest of the processor 205 is powered down by the reduction of the operating voltage 240 down to a zero state.

For other types of architectures and/or for processors that support different power management and/or normal operational states, the power management state control logic 242 may control transitions between two or more different power management and/or normal operational states using one or more signals that may be similar to or different from the signals shown in FIG. 2B.

The mass storage device 230 may include one or more compact disc read-only memory (CD-ROM) drive(s) and associated disc(s), one or more hard drive(s) and associated disk(s) and/or one or more mass storage devices accessible by the computing system 200 over a network. Other types of mass storage devices such as, for example, optical drives and associated media, are within the scope of various embodiments.

For one embodiment, the mass storage device 230 stores an operating system 245 that includes code 250 to support a current and/or a follow-on version of the Advanced Configuration and Power Interface (ACPI) specification. ACPI may be used to control some aspects of power management as described in more detail below. The operating system 245 may be a Windows™ or another type of operating system available from Microsoft Corporation of Redmond, Wash. Alternatively, a different type of operating system such as, for example, a Linux operating system, and/or a different type of operating system-based power management may be used for other embodiments. Further, the power management functions and capabilities described herein as being associated with ACPI may be provided by different software or hardware.

Also, it should be appreciated that system 200 may include a display device, such as a cathode ray tube (CRT) or liquid crystal display (LCD), for displaying information to a user. Further, system 200 may include an alphanumeric input device (e.g., a keyboard), including alphanumeric and other keys, for communicating information and command selections to processor 205. An additional user input device may be cursor control device, such as a mouse, trackball, trackpad, stylus, or cursor direction keys, for communicating direction information and command selections to processor 205, and for controlling cursor movement on the display device.

Another device that may included with system is a hard copy device, which may be used for printing instructions, data, or other information on a medium such as paper, film, or similar types of media. Furthermore, a sound recording and playback device, such as a speaker and/or microphone (not shown) may optionally be included in system 200 for audio interfacing.

Where the system 200 is a mobile or portable system, a battery or battery connector 255 may be included to provide power to operate the system 200 either exclusively or in the absence of another type of power source. Additionally, for some embodiments, an antenna 260 may be included and coupled to the system 200 via, for example, a wireless local area network (WLAN) device 261 to provide for wireless connectivity for the system 200.

(WLAN) device 261 may include a wireless communication module that may employ a Wireless Application Protocol to establish a wireless communication channel. The wireless communication module may implement a wireless networking standard such as Institute of Electrical and Electronics Engineers (IEEE) 802.11 standard, IEEE std. 802.11-1999, published 1999.

It should be appreciated that, in one embodiment, the processor 205 of FIG. 2A may transition between various known C-states. The normal operational state or active mode for the processor 205 is the C0 state in which the processor actively processes instructions. In the C0 state, the processor 205 is in a high-frequency mode (HFM) in which the voltage/frequency setting may be provided by the maximum voltage/frequency pair.

In order to conserve power and/or reduce thermal load, for example, the processor 205 may be transitioned to a lower power state whenever possible. For example, from the C0 state, in response to firmware, such as microcode, or software, such as the operating system 245, or even ACPI software in some cases, executing a HALT or MWAIT instruction (not shown), the processor 205 may transition to the C1 or Auto-HALT state. In the C1 state, portions of the processor 205 circuitry may be powered down and local clocks may be gated.

The processor may transition into the C2 state, also referred to as the stop grant or SLEEP state, upon assertion of the STPCLK# or similar signal by the I/O controller 225, for example. The I/O controller 225 may assert the STPCLK# signal in response to the operating system 245 determining that a lower power mode may be or should be entered and indicating this via ACPI software 250. In particular, one or more ACPI registers (not shown) may be included in the I/O controller 225 and the ACPI software 250 may write to these registers to control at least some transitions between states. During operation in the C2 state, portions of the processor 205 circuitry may be powered down and internal and external core clocks may be gated. For some embodiments, the processor may transition directly from the C0 state into the C2 state.

Similarly, the processor 205 may transition into the C3 state, also referred to as the Deep Sleep state, in response to the I/O controller 225 or other chipset feature asserting a CPUSLP# signal and then a DPSLP# signal or other similar signals. In the Deep Sleep state, in addition to powering down internal processor circuitry, all phase-lock loops (PLLs) in the processor 205 may be disabled. Further, for some embodiments, a STOP_CPU signal may be asserted by the input/output controller 225 and received by the clock generator 211 to cause the clock generator to halt the clock signal CLK to the CPU 205.

In the system 200 of FIGS. 2A and 2B, a transition into the C4 state or into a zero voltage sleep state may be undertaken in response to ACPI software 250 detecting that there are no pending processor interrupts, for example. ACPI software may do this by causing the ICH 225 to assert one or more power management-related signals such as the exemplary Deeper Stop (DPRSTP#) signal and the exemplary DPSLP# signal. The Deeper Stop (DPRSTP#) signal is provided directly from the chipset to the processor and causes clock/power management logic 350 on the processor to initiate a low frequency mode (LFM). For the low frequency mode, the processor may transition to the minimum or another low operating frequency, for example.

According to some embodiments of the invention, as will be described hereinafter, assertion of the DPRSTP# signal may further cause the internal VID target to be set to a zero voltage level, resulting in a zero operational voltage being applied to the processor 205 by the voltage regulator 212, such that the processor transitions into a very deep sleep state that has very low power consumption characteristics.

According to one embodiment of the invention, an integrated circuit such as processor 205, for example, may initiate a transition to a zero voltage power management state. In one example, processor 205 may be a central processing unit (CPU) 205. Further, the zero voltage management state may be, for example, a deeper sleep state in accordance with ACPI standards. During this transition, the critical state of the CPU 205 may be saved. For example, critical state variables associated with the CPU 205 may be saved in dedicated cache memory (e.g. SRAM) 340.

The operating voltage of the CPU 205 may be subsequently reduced to zero such that the CPU 205 is in a very deep sleep state that has very low power consumption characteristics. Particularly, the voltage regulator 212 utilizing zero voltage sleep state logic 302 may reduce the operating voltage 240 down to zero. As previously discussed, this may be done in conjunction with zero voltage entry/exit logic 354 of clock/power management logic 350 of CPU 205.

In one embodiment, this zero voltage power management state, when implemented in conjunction with ACPI standards, may be referred to as the C6 state.

Subsequently, in response to receiving a request to exit the zero voltage power management state, the CPU 205 exits the zero voltage power management state at a higher reference operating voltage. Particularly, under the control of zero voltage entry/exit logic 354 of CPU 205 and zero voltage sleep logic 302 of voltage regulator 212, as previously described, voltage regulator 212 may raise the reference operating voltage 240 to a suitable level such that the CPU 205 may operate properly. The critical state variables of CPU 205 are then restored from the dedicated cache memory 340.

Thus, the power management scheme allows the CPU 205 to save its state, turn off the power and then wake up when necessary, restore the critical state, and continue where the CPU left off. This may be done, in some embodiments, without explicit support from the operating system 245, and may be accomplished with an extremely short latency period.

More particularly, in one embodiment, in the zero voltage processor sleep state, (which may be referred to as a C6 state in accordance with ACPI standards), the critical state of the CPU 205 is saved in dedicated sleep state SRAM cache 340, which may be powered off the I/O power supply (V.sub.I/O) 349, while the core operating voltage 240 for the CPU 205 is taken down to approximately 0 Volts. At this point, the CPU 205 is almost completely powered off and consumes very little power.

Upon an exit event, the CPU 205 indicates to the voltage regulator 212 to ramp the operating voltage 240 back up (e.g. with a VID code 235), relocks the phase lock loop (PLLs) and turns the clocks back on via clock/power management logic 350 and zero voltage entry/exit logic 354. Further, CPU 205 may perform an internal RESET to clear states, and may then restore the state of the CPU 205 from the dedicated sleep state SRAM cache 340, and CPU 205 continues from where it left off in the execution stream. These operations may be done in a very small time period (e.g., approximately 100 microseconds), in CPU 205 hardware, such that it is transparent to the operating system 245 and existing power management software infrastructure.

In one embodiment, this methodology is particularly suited for a CPU 205 having multiple processor cores. In this example, core 320 (e.g. Core #0) and core 322 (e.g. Core #1), i.e. a dual-core CPU, will be discussed as an example. However, it should be appreciated that any suitable number of CPU cores may be utilized. In the dual-core structure, the CPU cores 320 and 322 utilize a shared cache 330. For example, this shared cache 330 may be a level 2 (L2) cache 320 that is shared by the cores 320 and 322.

Further, each core 320 and 322 includes a core ID 321, microcode 323, a shared state 324, and a dedicated state 325. The microcode 323 of the cores 320 and 322 is utilized in performing the save/restore functions of the CPU state and for various data flows in the performance of the zero voltage processor sleep state in conjunction with the zero voltage entry/exit logic 354 of the clock/power management logic 350 of CPU 205. Further, dedicated sleep state SRAM cache 340 is utilized to save the states of the cores, as will be described in more detail below.

It will be appreciated that the system 200 and/or other systems of various embodiments may include other components or elements not shown in FIGS. 2A and 2B and/or not all of the elements shown in FIGS. 2A and 2B may be present in systems of all embodiments.

Figure 3:
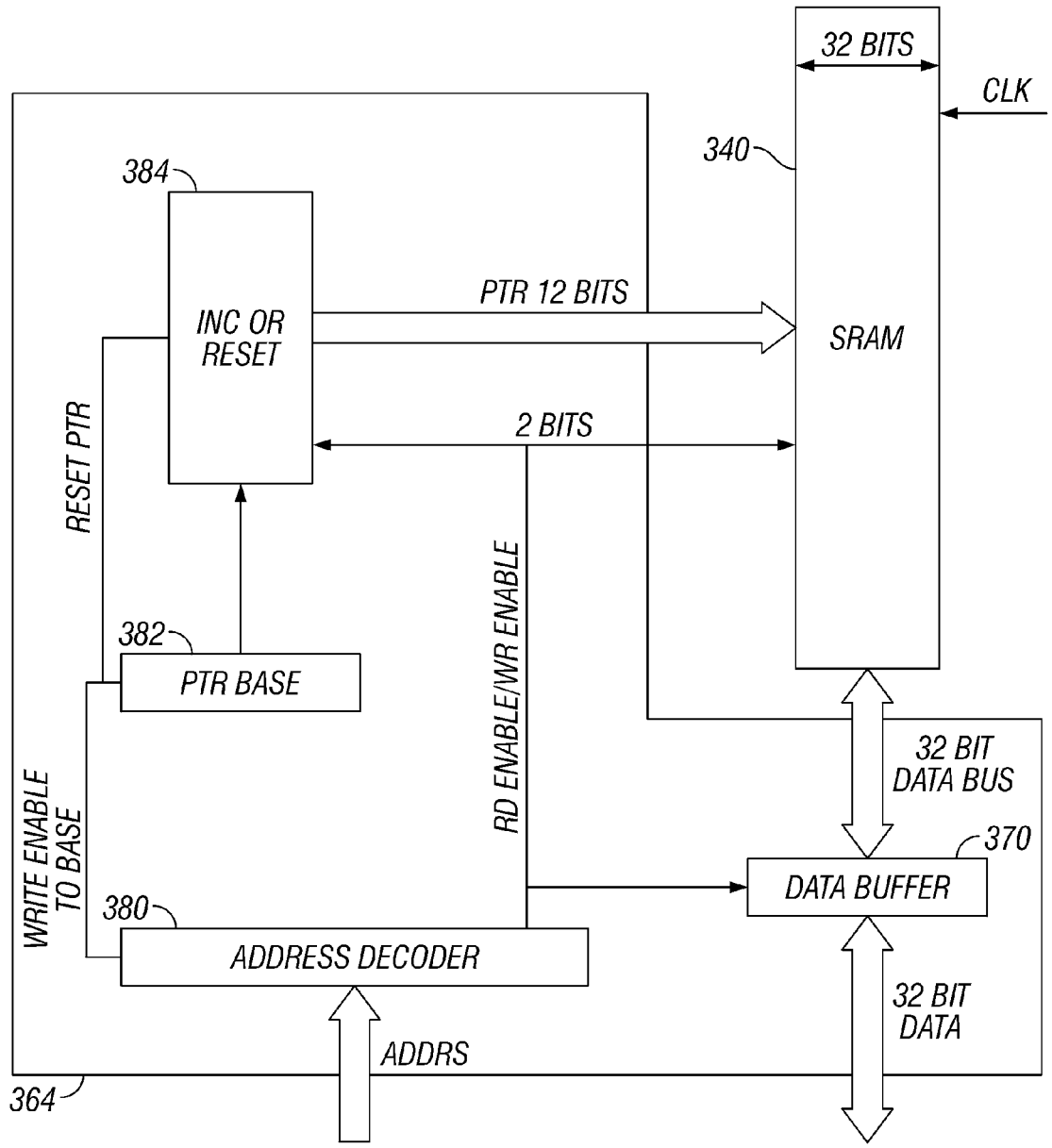
FIG. 3 is a block diagram illustrating an example of a dedicated sleep state SRAM cache and an SRAM interface, according to one embodiment of the present invention.

Turning briefly to FIG. 3, FIG. 3 is a block diagram illustrating an example of dedicated sleep state SRAM cache 340 and an SRAM interface 364, according to one embodiment of the present invention. The dedicated sleep state SRAM cache 340 may store state variables associated with the architectural, micro-architectural, debug state, and microcode patch when CPU 205 is in the zero voltage sleep state (e.g. the C6 state) previously described.

In one example, the size of the SRAM 340 may be 8 KB per CPU core and may be 32 bits wide and may be clocked by the clock/power management logic 350. As previously discussed, the dedicated sleep state SRAM cache 340 may be powered by I/O voltage ($V_{I/O}$ 349) such that its contents are retained when the operating voltage for the CPU 205 is shut off.

The dedicated sleep state SRAM 340 may be structured as 2K entries of 32 bits each and may have ECC protection for single bit error detection and correction. The data path may be 32 bits and support a 2-cycle latency into the array. As can be seen in FIG. 3, the SRAM interface 364 may include a 32 bit data bus from a data buffer 370 which utilizes 32 bit data.

In one example, a control register bus interface may be utilized to interface to the microcode in a simple fashion by utilizing a front end cluster interface to reduce the complexity of addressing the SRAM. The interface may use 2K control registers and a two-level addressing scheme. Two registers may be defined to address the SRAM—the first may be a SRAM base register and the second may be an SRAM data register. Microcode may initialize the base register before starting to access the SRAM. The content of the base register may be used as an index into the SRAM for the next read/write to the data register. After every access to the data register, the index into the SRAM may be auto-incremented by one.

As illustrated in FIG. 3, in one example, the SRAM interface 364 may include a data buffer 370 that buffers 32 bit data into and out of SRAM 340 based upon read/write enablement signals from address decoder 380. Address decoder 380 may also enable a write enable to base register 382 and a reset pointer. Base register 382 may be used to increment register 384 which operates on SRAM 340 by a 12 bit pointer and a 2 bit read/write enable. The content of the base register 382 may be used as an index into the SRAM for the next read/write to the data register. After every access to the data register, the index into the SRAM may be auto-incremented by one. Further, based on a reset pointer, register 384 may reset the SRAM.

Figure 4:
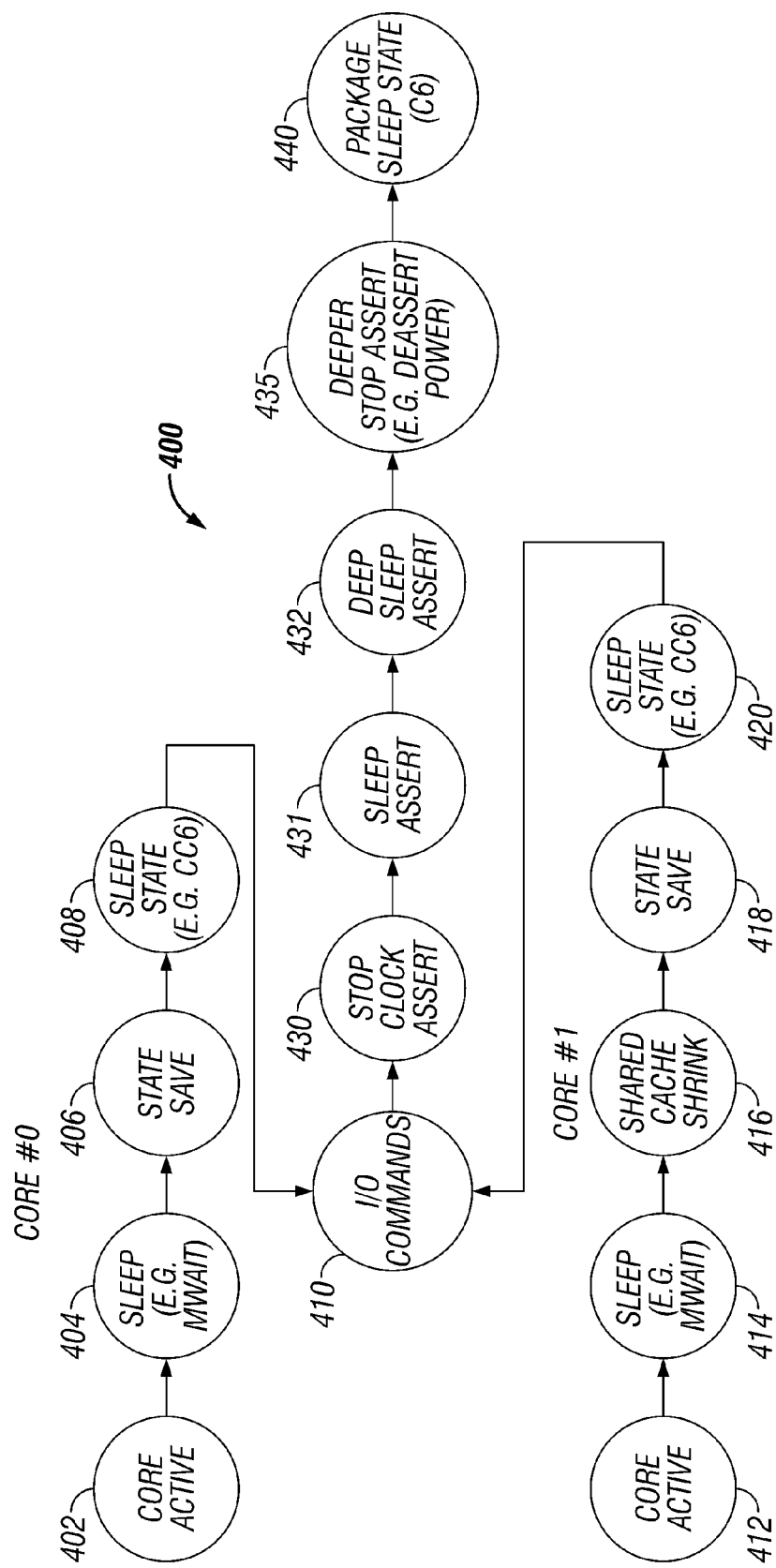
FIG. 4 is a flow diagram illustrating a process that may be utilized to enter into a zero voltage processor sleep state, according to one embodiment of the present invention.

Turning now to FIG. 4, FIG. 4 is a flow diagram illustrating a process 400 that may be utilized to enter the zero voltage processor sleep state, according to one embodiment of the present invention. In one embodiment, the following series of operations may be directed by the microcode 323 of the CPU cores 320 and 322 of CPU 205. In the ACPI embodiment, setting forth the C6 state, the entry into the zero voltage processor sleep state may be initiated via an MWAIT instruction, as previously discussed.

From a software point of view, each CPU core 320 or 322 may independently execute the MWAIT instruction. However, in one embodiment, the CPU cores 320 and 322 utilize an L2 shared cache 330 and the same voltage plane. Hence, in this embodiment, there needs to be hardware coordination in the CPU 205 for package level C states, and particularly, the C6 state.

In this embodiment, each core 320 and 322 may execute an MWAIT instruction, and the initializing CPU core goes into a waiting state (e.g. CC6) and waits for the other core to get into the CC6 state as well, before the whole package (e.g. including both cores 320 and 322) may transition into what may be termed the package C6 sleep state.

Looking particularly at FIG. 4, an illustration of entry into the zero voltage processor sleep state is provided. As shown in FIG. 4, each core independently performs a state save when the zero voltage processor sleep state is initiated. Particularly, looking at CPU core #0 320, the first CPU core #0 is active (circle 402) and then a command for a zero voltage sleep state is initiated (e.g. via a sleep or MWAIT instruction) (circle 404). Responsive to this, the state of CPU core 320 is saved at circle 406 to dedicated cache memory 340. This includes the dedicated state 325 and the shared state 324. CPU core 320 then goes into a first sleep state 408 (e.g. CC6) in which it waits for the other core to get into the CC6 state as well, before the whole package can transition into the overall package sleep state (e.g. C6).

In the same manner, the other CPU core (e.g. CPU core #1 322) likewise commands a sleep instruction (e.g. MWAIT) at circle 414 and its state (e.g. both its shared state 324 and dedicated state 325) is also stored to the dedicated cache memory 340 (circle 418). However, in this case, since this is the last core to go into a sleep state, the shared cache 330 is also shrunk and saved to dedicated cache memory 340 (circle 416). Then at circle 420, the second CPU core 322 likewise enters a sleep state (e.g. CC6).

It should be noted that the microcode 323 of the CPU cores 320 and 322 may generally need to know which control registers need to be saved and restored for the zero voltage processor sleep state. The list of the registers may be a subset of the total registers on the CPU 205. For example, the list may be saved as a bit vector (e.g. 1024 bits long). Each bit in the vector may correspond to one control register in the control register address base. For example, microcode may translate the bit position into the control register address and save/restore the register if the bit is "1" and skip it if the bit is a "0". If a control register requires special handling, the save/restore bit in the vector may be set to "0" and the save/restore handled by special microcodes flow outside of the main save/restore loop.

After microcode operations have been performed, as previously discussed, the zero voltage entry/exit logic 354 of the clock/power management logic 350 takes over the data flows (e.g. C6 flows). Particularly, this occurs after the microcode operations are finished as to state saves (406 and 418) and after each CPU core 320 and 322 has reached an individual sleep state 408 and 420 (e.g. CC6 state).

At this point, all the required state of the CPU 205 has been saved or flushed from the CPU 205. The zero voltage entry/exit logic 354 of the clock/power management logic 350 then initiates an external platform level entry sequence (e.g. a C6) sequence by performing an I/O register read from the ICH 225. In one embodiment, this may be the ACPI defined method of entering CPU "C" states.

The sequence of events from the external bus perspective from this point is shown in FIG. 4. The I/O commands 410 may be issued from the ICH 225/MCH 215. Particularly, a stop clock signal may be asserted at circle 430 (e.g. STP-CLK#). Then, a sleep signal may be asserted. (circle 431) (e.g. SLP#). Further, at circle 432, a deep sleep signal may be asserted (DPSLP#). These commands are issued in the previously-described order such that the CPU 205 responds by shutting off its internal clock distribution and then the PLLs.

When at circle 435, a deeper stop signal is asserted (e.g. DPRSTP#), the CPU 205 switches its VID to a zero voltage level in order to tell the voltage regulator 212 to remove power and that it is safe to do so. This may be referred to as a C6 VID. In this way, power is deasserted. However, it should be appreciated that instead of zero volts, an otherwise very small amount of voltage may be chosen as the VID.

It should be appreciated that instead of an exact zero voltage level, the voltage level may set to an "approximately zero voltage level." This approximately zero voltage level may be a very low voltage level, such as 0.3V or 0.5V. In some embodiments, such a very low approximately zero voltage level may optimize entry and exit latencies to and from the sleep state, respectively. Additionally, it should be appreciated, that the approximately zero voltage level may chosen for the system (e.g. in silicon) during manufacturing (e.g. after a tape-out) and may be programmed differently during different steppings and revisions of the CPU.

The package of CPU cores (e.g. core 320 and core 322) is considered to be in a package sleep state (C6) at circle 440 when the operating voltage 240 from voltage regulator 212 reaches zero volts or another nominally small level. It should be noted that since there is no active device pulling down the operating voltage, it simply drifts down slowly as the charge leaks away due to the CPU 205 leakage. Thus, the CPU 205 has entered the zero voltage package sleep state (C6). It should be appreciated that the sequence of operations previously described may be effectuated in a variety of different orders, and that the previously described order of operations is just one example.

Figure 5:
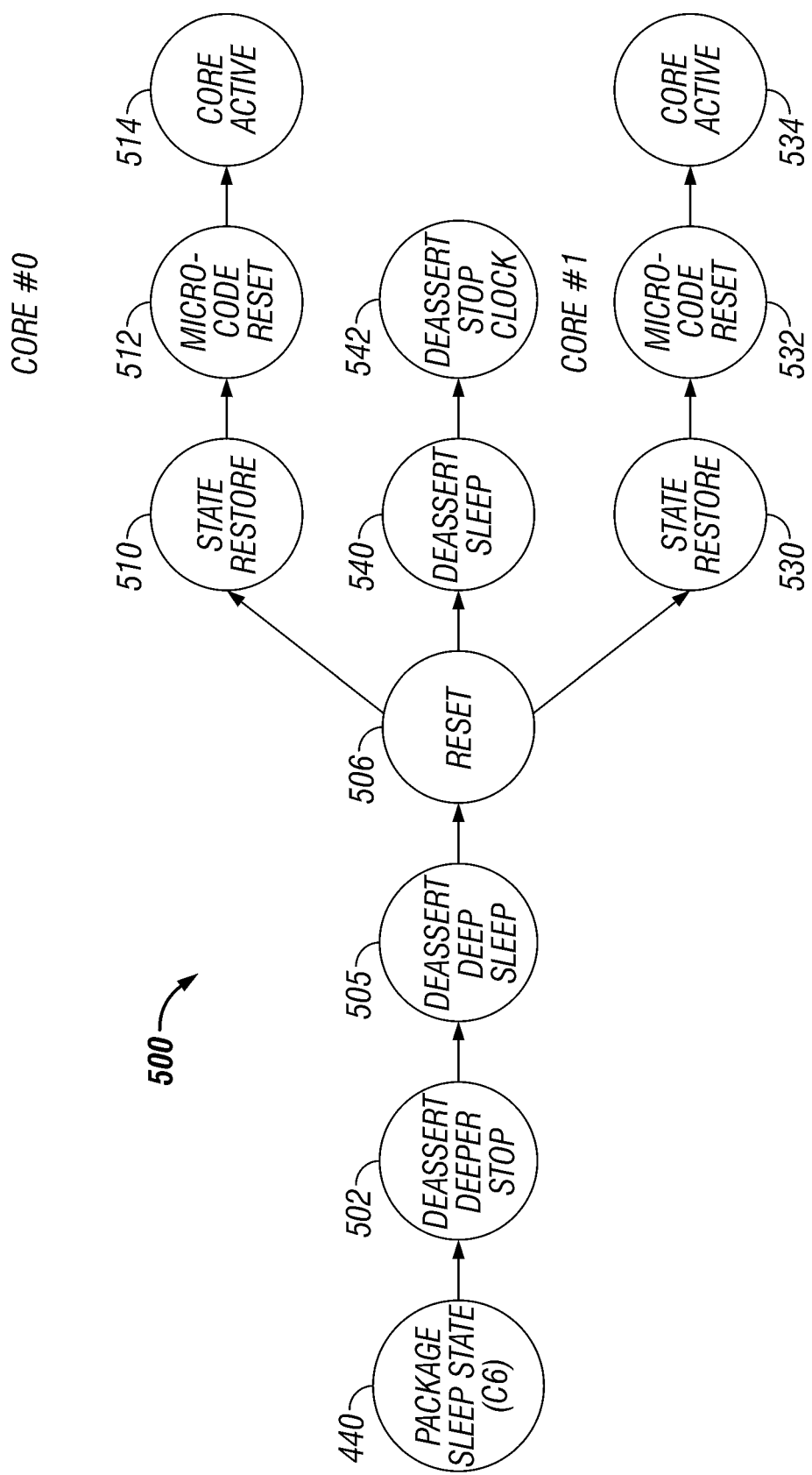
FIG. 5 is a flow diagram illustrating a process that may be utilized to exit out of the zero voltage processor sleep state, according to one embodiment of the invention.

Turning now to FIG. 5, FIG. 5 is a flow diagram illustrating an example of a process 500 for an exit sequence from the zero voltage processor sleep state. Typically, an exit out of the zero voltage processor sleep state begins when the chipset detects an event that necessitates waking up the CPU 205—most likely an interrupt event. However, it should be noted that the chipset may proceed with master accesses to memory without waking up the CPU when doing snoops. The sequence of external events and handshakes that occur between the chipset and the CPU 205 during an exit from the zero voltage processor sleep state will be discussed with reference to FIG. 5. Particularly, this sequence may be considered the reverse of what happens during the previously-described entry phase.

From the package sleep state (C6) (circle 440) in one embodiment, the deeper stop signal (DPRSTP#) is deasserted (circle 502) which is detected by the CPU 205 and the zero voltage entry/exit logic 354 of the clock/power management logic 350 such that the low frequency mode (LFM) VID is sent to the voltage regulator 212. This indicates to the voltage regulator 212 to drive the core operational voltage back up to the required VID.

At a predetermined time (e.g. controlled by timers in the ICH 225), a signal to assert the clocks back on is asserted and the deep sleep (DPSLP#) signal is de-asserted (circle 505), which initiates the PLLs of the clock/power management logic 350. After this, CPU 205 initiates an internal RESET (circle 506). After this reset is complete, CPU 205 has the power and clocks engaged and is ready to restore the critical state variables associated with the CPU 205.

As an example, in the ACPI embodiment, typically during a C-state exit event, CPU 205 waits until the STPCLK# deassertion to do anything internally within the CPU. However, according to embodiments of the present invention, in the zero voltage processor sleep state (e.g. C6) due to the longer latency of restoring the states, etc., STPCLK# is overridden and a state restore (circle 510 and circle 530) for the respective cores 320 and 322 of the CPU 205 is begun in preparation of the C6 exit as soon as the power and clocks are available. Once the states of the cores 320 and 322 are restored, CPU 205 is ready to continue from where it stopped. Microcode 323 from both of the cores 320 and 322 of the CPU 205 are reset (circles 512 and 532), respectively.

However, neither of the CPU cores 320 and 322 become active (circles 514 and 534), respectively, and being executing instructions, until the sleep signal is de-asserted (circle 540) and the stop clock signal (STPCLK#) is de-asserted. However, once the stop clock is de-asserted and the sleep signal is deasserted, both the CPU 205 and cores 320 and 322 and the chipset are all powered on and are operational, and both cores become active (circle 514 and circle 534). CPU 205 then typically begins some code fetches since its caches are empty and then will begin normal operations. More particularly, both cores are woken up in the C0 state. The operating system may determine which CPU core will handle events and the other core may be put back into a sleep state soon thereafter.

Advantageously, as explained earlier, because CPU 205 does the majority of C-state coordination in hardware, software can independently request to enter the zero voltage processor sleep state (e.g. C6) in each core without any software coordination with the other core. More particularly, by utilizing the zero voltage processor sleep state (e.g. C6) the power required by the CPU 205 in the sleep state is reduced virtually to zero.

Also, in the ACPI embodiment, in which the C6 state is described, an efficient method to achieve the state save and the restoration of the shared state 324 of the cores 320 and 322 of processor 205 using a core ID field 321 is also disclosed. This method serves as the synchronization for the core exit into C0. The core identifiers 321 may be hardwired into each core 320 and 322 via fuses and may be available at all times to the cores of the CPU 205.

Both the cores 320 and 322 may save the dedicated state 325 and the shared state 324 at the time of entry. The cores 320 and 322 preferably will not use any ordering method (like a semaphore) during the state save. At the end of the state save, each core may record its unique core identifier 321 in a hardware state.

When the second core completes its state save, that core may write its unique core identifier 321 in the same hardware state, effectively overriding the core identifier of the first core. This hardware state that contains the core identifier will be saved during the C6 residence by powering it with an always ON power source. At C6 exit, as previously discussed, when the cores 320 and 322 perform state restore, the core identifier that matches the stored core identifier will be allowed to perform the restore of the shared state 324. Both cores 320 and 322 may perform the restore of the dedicated state 325. The cores will then access the stored core identifier 321 to check whether they need to perform the restore of the stored state. Merely one core needs to be allowed to perform the restore. The other cores may wait while the shared state 324 is being restored. When the restore is complete, both the cores proceed to the C0 state.

In one embodiment, the cores 320 and 322 may use a hardware semaphore "C6 order semaphore" to ensure exclusive access to the core identifier 321 field during restore. An example of pseudo-code to enable the shared state restore is provided below:

Core that Went into CC6 First
Restore dedicated state
Grab C6 Order Semaphore
Read C6 wakeup.coreID Match C6 wakeup.coreID against own coreID
No match, release C6 Order Semaphore
Restore_Complete: Wait
Read C6 wakeup.coreID
If coreID !=00 jump to Restore Complete
If coreID=0 jump to instruction after mwait
Core that Went into CC6 Last
Restore dedicated state
Grab C6 Order Semaphore
Read C6 wakeup.coreID
Match C6 wakeup.core ID against own coreID
Match, lock C6 Order Semaphore
Go to shared state restore It will be appreciated that, while exemplary embodiments have been described in reference to zero voltage processor sleep state that transitions into and out of a deeper sleep C6 state associated with a central processing unit and voltage regulator, that various embodiments may be applied to different types of power management configurations and/or for different types of integrated circuits. Further, although voltage control is accomplished using VID signals for the exemplary embodiments described herein, other approaches to providing voltage control are within the scope of various embodiments.

Thus, various embodiments of a method and apparatus for a zero voltage process sleep state are described. In the foregoing specification, embodiments of the invention have been described with reference to specific exemplary embodiments thereof. It will, however, be appreciated that various modifications and changes may be made thereto without departing from the broader spirit and scope of the invention as set forth in the appended claims. Thus, the specification and drawings are, accordingly, to be regarded in an illustrative rather than a restrictive sense.

What is claimed is:

1. A system comprising:
a graphics processor;
a wireless communication module;
a memory controller; and
a multi-core processor, the multi-core processor including:
a first processor core, the first processor core to save a state of the first processor core and to enter a mode in which the first processor core is powered off;
a second processor core, the second processor core to save a state of the second processor core and to enter a mode in which the second processor core is powered off; and
a cache memory, the cache memory to be powered when the first processor core is powered off;
wherein the first processor core is to restore the saved state of the first processor core in response to the first processor core transitioning to a mode in which the first processor core is powered, and the second processor core is to restore the saved state of the second processor core in response to the second processor core transitioning to a mode in which the second processor core is powered.

2. The system of claim 1, wherein the first processor core is to save the state of the first processor core in the cache memory.

3. The system of claim 1, wherein the first processor core is to enter the mode in which the first processor core is powered off in response to execution of an instruction by the first processor core.

4. The system of claim 3, wherein the second processor core is to enter the mode in which the second processor core is powered off in response to execution of an instruction by the second processor core.

5. The system of claim 1, wherein the first processor core is to restore the saved state of the first processor core when reset.

6. The system of claim 5, wherein the second processor core is to restore the saved state of the second processor core when reset.

7. The system of claim 1, wherein the first processor core is to transition to the mode in which the first processor core is powered in response to a signal from a power management controller.

8. The system of claim 7, wherein the second processor core is to transition to the mode in which the second processor core is powered in response to a signal from the power management controller.

9. The system of claim 1, wherein the first processor core is to save and restore registers of the first processor core.

10. The system of claim 1, wherein the first processor core is to save and restore a debug state of the first processor core.

11. The system of claim 1, further comprising an integrated voltage regulator.

12. The system of claim 1, wherein the cache memory comprises a static random access memory.

13. The system of claim 1, further comprising a power management unit to control transition of the first processor core between a first operating point and a second operating point.

14. The system of claim 1, further comprising an integrated circuit comprising the multi-core processor.

15. The system of claim 1, wherein the cache memory comprises a dedicated cache memory.

16. The system of claim 1, wherein the multi-core processor further comprises a shared cache memory.

17. The system of claim 1, wherein the mobile system comprises a personal digital assistant.

18. The system of claim 1, wherein the mobile system comprises a telephone.

19. The system of claim 1, wherein the multi-core processor further comprises a power management logic to access a voltage identification code from a table.

* * * * *